United States Patent
Ogata et al.

(10) Patent No.: US 10,844,167 B2
(45) Date of Patent: Nov. 24, 2020

(54) COMPOSITION FOR FORMING RESIST UNDERLAYER FILM AND METHOD FOR FORMING RESIST PATTERN USING SAME

(71) Applicant: NISSAN CHEMICAL INDUSTRIES, LTD., Tokyo (JP)

(72) Inventors: Hiroto Ogata, Toyama (JP); Yuki Usui, Toyama (JP); Mamoru Tamura, Toyama (JP); Takahiro Kishioka, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 115 days.

(21) Appl. No.: 16/081,668

(22) PCT Filed: Feb. 23, 2017

(86) PCT No.: PCT/JP2017/006882
§ 371 (c)(1),
(2) Date: Aug. 31, 2018

(87) PCT Pub. No.: WO2017/154600
PCT Pub. Date: Sep. 14, 2017

(65) Prior Publication Data
US 2019/0177475 A1    Jun. 13, 2019

(30) Foreign Application Priority Data

Mar. 9, 2016   (JP) ................. 2016-045965

(51) Int. Cl.
| | |
|---|---|
| C08G 63/688 | (2006.01) |
| G03F 7/20 | (2006.01) |
| G03F 7/09 | (2006.01) |
| H01L 21/027 | (2006.01) |
| C08G 63/42 | (2006.01) |
| C08G 63/58 | (2006.01) |
| G03F 7/16 | (2006.01) |

(52) U.S. Cl.
CPC ........... C08G 63/688 (2013.01); C08G 63/42 (2013.01); C08G 63/58 (2013.01); G03F 7/091 (2013.01); G03F 7/094 (2013.01); G03F 7/168 (2013.01); G03F 7/20 (2013.01); H01L 21/027 (2013.01); H01L 21/0276 (2013.01)

(58) Field of Classification Search
CPC ...... C08G 63/42; C08G 63/58; C08G 63/688; G03F 7/091; G03F 7/094; G03F 7/168; G03F 7/20; H01L 21/027; H01L 21/0276
See application file for complete search history.

(56) References Cited

U.S. PATENT DOCUMENTS

2011/0053091 A1* 3/2011 Hiroi .................... C08G 59/186
                                                                    430/319
2012/0251955 A1* 10/2012 Sakamoto .............. C08G 59/12
                                                                    430/296

FOREIGN PATENT DOCUMENTS

| TW | 575631 | * 11/2004 |
| WO | 2007/111147 A1 | 10/2007 |
| WO | 2009/096340 A1 | 8/2009 |
| WO | 2015/098525 A1 | 7/2015 |

OTHER PUBLICATIONS

May 23, 2017 Written Opinion issued in International Patent Application No. PCT/JP2017/006882.
May 23, 2017 Search Report issued in International Patent Application No. PCT/JP2017/006882.
Apr. 20, 2020 Office Action issued in Taiwanese Patent Application No. 106107409.

* cited by examiner

*Primary Examiner* — Ling Siu Choi
*Assistant Examiner* — Gennadiy Mesh
(74) *Attorney, Agent, or Firm* — Oliff PLC

(57) ABSTRACT

A composition for forming a resist underlayer film that has a high dry etching rate, functions as an anti-reflective coating during exposure, and fills a recess having a narrow space and a high aspect ratio. A composition for forming a resist underlayer film has a copolymer having a structural unit of following formula (1), a cross-linkable compound, a cross-linking catalyst, and a solvent:

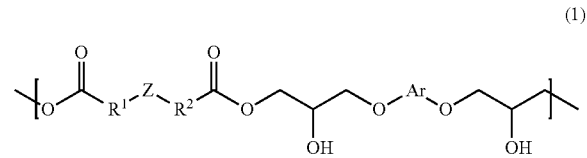

(1)

wherein $R^1$ and $R^2$ are each independently a $C_{1-3}$ alkylene group or a single bond, Z is an —O— group, a —S— group, or a —S—S— group, and Ar is an arylene group. The copolymer is synthesized by a reaction of a carboxyl group of a dicarboxylic acid compound having an —O— group, a —S— group, or a —S—S— group with an epoxy group of a diglycidyl ether compound having an arylene group.

3 Claims, 4 Drawing Sheets

COMPOSITION FOR FORMING RESIST UNDERLAYER FILM AND METHOD FOR FORMING RESIST PATTERN USING SAME

TECHNICAL FIELD

The present invention relates to a composition for forming a resist underlayer film that has a high dry etching rate, functions as an anti-reflective coating during exposure, and fills a recess having a narrow space and a high aspect ratio.

BACKGROUND ART

For example, formation of a fine resist pattern on a substrate by a photolithography technique including an exposure step using a KrF excimer laser or an ArF excimer laser as a light source has been known in manufacture of a semiconductor element. Light of the KrF excimer laser or ArF excimer laser incident to a resist film before formation of a resist pattern (incident light) is reflected on a surface of the substrate to generate a standing wave in the resist film. This standing wave is known to prevent formation of a resist pattern having a desired shape. For suppression of generation of the standing wave, formation of an anti-reflective coating that absorbs incident light between the resist film and the substrate is also known. When this anti-reflective coating is provided as a lower layer of the resist film, the anti-reflective coating is required to have a higher dry etching rate than that of the resist film.

Patent Document 1 describes a composition for forming a resist underlayer film including a polymer having at least one sulfur atom in a structural unit. When the composition described in Patent Document 1 is used, a resist underlayer film or an anti-reflective coating that have a higher dry etching rate than that of a resist film can be obtained. On the other hand, when a substrate having a recess in a surface is used in manufacture of a semiconductor element, a gap-filling material that allows the recess of the substrate to be filled or a flattened film is required. However, Patent Document does not describe or suggest recess-filling properties.

Patent Document 2 describes a composition for forming a resist underlayer film containing a copolymer having a triazine ring and a sulfur atom in a main chain. When the composition described in Patent Document 2 is used, a resist underlayer film that has a far higher dry etching rate than that of a resist film, functions as an anti-reflective coating during exposure without decreasing the dry etching rate, and allows a hole (diameter: 0.12 μm, depth: 0.4 μm) of a semiconductor substrate to be filled is obtained.

PRIOR ART DOCUMENTS

Patent Documents

Patent Document 1: International publication WO2009/096340
Patent Document 2: International publication WO2015/098525

SUMMARY OF THE INVENTION

Problem to be Solved by the Invention

In manufacture of a semiconductor element, a resist underlayer film satisfying all requirements including a high dry etching rate, a function as an anti-reflective coating during exposure, and filling a recess of a semiconductor substrate is required. However, when the recess is a trench having a narrow space and a high aspect ratio, the recess is not completely filled with a conventional composition for forming a resist underlayer film with ease.

Means for Solving the Problems

In order to solve the above-described problems, the present invention provides a composition for forming a resist underlayer film containing specific copolymer, cross-linkable compound, cross-linking catalyst, and solvent. That is, a first aspect of the present invention is a composition for forming a resist underlayer film comprising a copolymer having a structural unit of the following formula (I), a cross-linkable compound, a cross-linking catalyst, and a solvent.

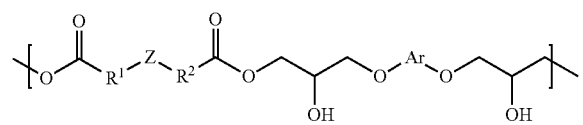

(1)

(wherein $R^1$ and $R^2$ are each independently a $C_{1-3}$ alkylene group or a single bond, Z is an —O— group, a —S— group, or a —S—S— group, and Ar is an arylene group.) When $R^1$ and $R^2$ are each independently a single bond, the —O— group, —S— group, or —S—S— group of Z binds to a carbon atom of a carbonyl group via the single bond.

For example, the arylene group is selected from a phenylene group and a naphthylene group.

For example, the cross-linkable compound is at least one compound selected from the group consisting of a nitrogen-containing compound having at least two nitrogen atoms bonded to hydroxymethyl groups or alkoxymethyl groups, an aromatic compound having at least two hydroxymethyl groups or alkoxymethyl groups, a compound having at least two epoxy groups, and a compound having at least two blocked isocyanate groups.

The composition for forming a resist underlayer film of the present invention may further contain a surfactant.

A second aspect of the present invention is a method comprising steps of applying the composition for forming a resist underlayer film according to the first aspect of the present invention to a substrate having a recess in a surface, and baking the composition for forming a resist underlayer film to form a resist underlayer film for filling at least the recess.

The method may further include a step of forming a photoresist pattern on the resist underlayer film after the step of forming the resist underlayer film.

The substrate is, for example, a semiconductor substrate having a trench having a width of 0.005 μm to 0.20 μm or 0.01 μm to 0.10 μm and an aspect ratio of 1 to 50 or 5 to 10. The aspect ratio is a value of ratio of the depth to the width of the trench.

Effects of the Invention

The composition for forming a resist underlayer film of the present invention contains a copolymer having at least two ether bonds and an arylene group in a main chain. When such a composition for forming a resist underlayer film is used, a resist underlayer film that functions as an anti-reflective coating during exposure without decreasing the dry etching rate, has a largely decreased amount of sublimate generated during baking, and allows a trench having a narrow space and a high aspect ratio to be completely filled is obtained.

MODES FOR CARRYING OUT THE INVENTION

Figure 1:
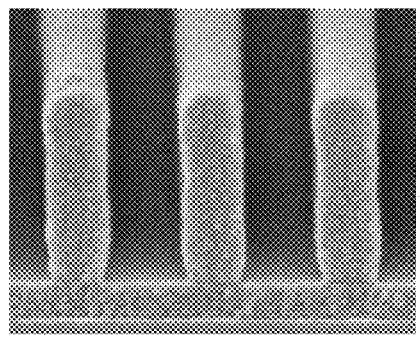
FIG. 1 is a cross-sectional SEM image of a photoresist pattern formed on a resist underlayer film formed from a composition for forming a resist underlayer film of Example 1.
Figure 2:
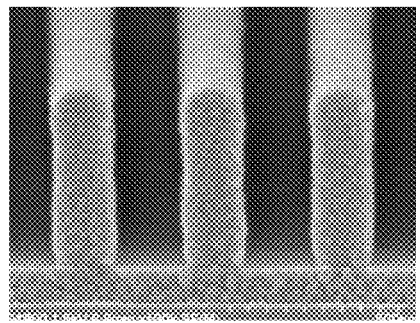
FIG. 2 is a cross-sectional SEM image of a photoresist pattern formed on a resist underlayer film formed from a composition for forming a resist underlayer film of Example 2.
Figure 3:
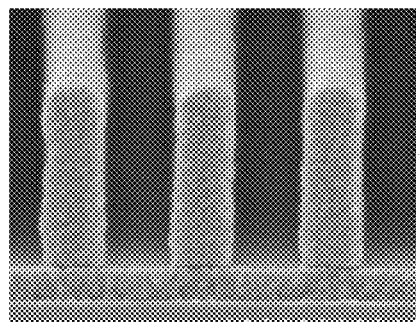
FIG. 3 is a cross-sectional SEM image of a photoresist pattern formed on a resist underlayer film formed from a composition for forming a resist underlayer film of Example 3.
Figure 4:
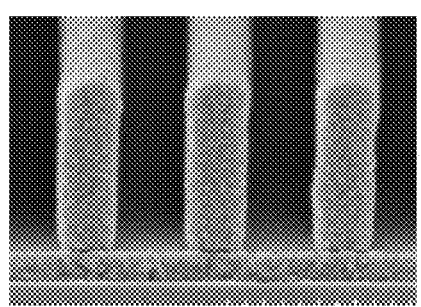
FIG. 4 is a cross-sectional SEM image of a photoresist pattern formed on a resist underlayer film formed from a composition for forming a resist underlayer film of Example 4.
Figure 5:
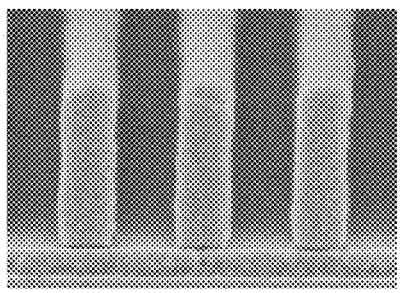
FIG. 5 is a cross-sectional SEM image of a photoresist pattern formed on a resist underlayer film formed from a composition for forming a resist underlayer film of Example 5.

A copolymer constituting the composition for forming a resist underlayer film of the present invention is synthesized by a reaction of a carboxyl group of a dicarboxylic acid compound having an —O— group, a —S— group, or a —S—S— group with an epoxy group of a diglycidyl ether compound having an arylene group.

Specific examples of the dicarboxylic acid compound having an —O— group, a —S— group, or a —S—S— group include compounds of formulae (a) to (i). Further, specific examples of the diglycidyl ether compound having an arylene group include compounds of the following formulae (j) to (q).

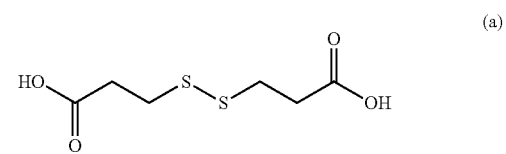

(a)

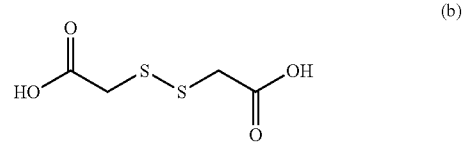

(b)

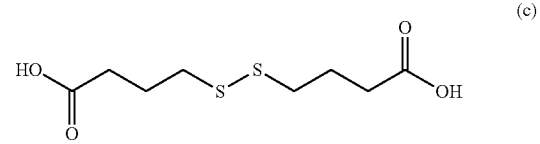

(c)

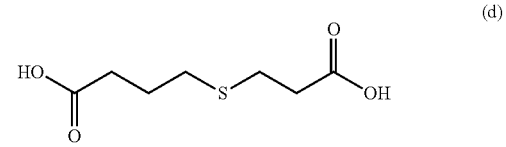

(d)

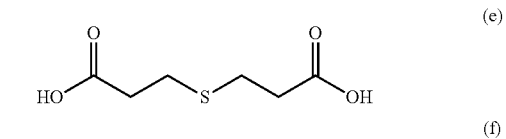

(e)

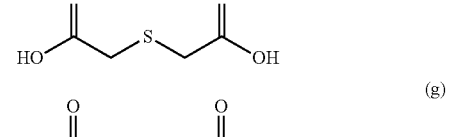

(f)

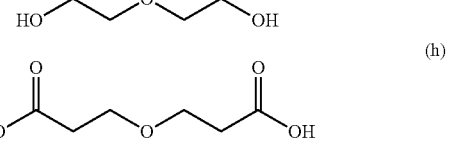

(g)

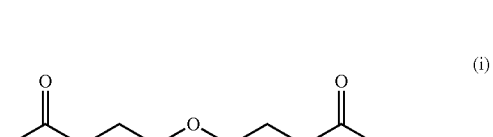

(h)

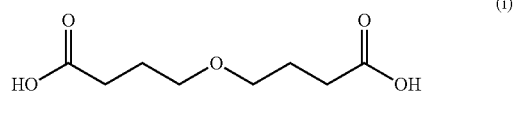

(i)

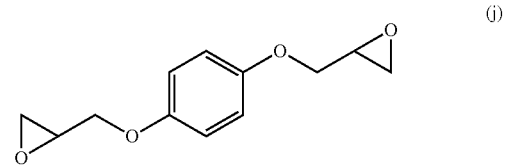

(j)

(k)
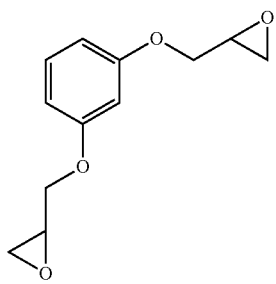

(l)
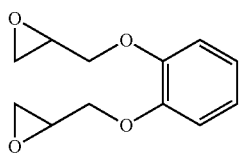

(m)
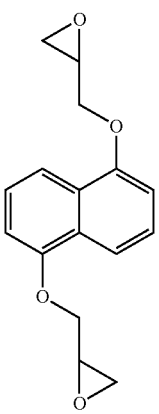

(n)
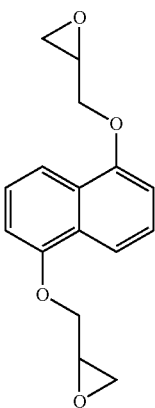

(o)
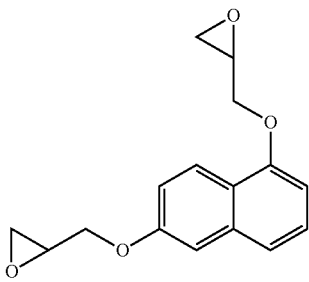

(p)
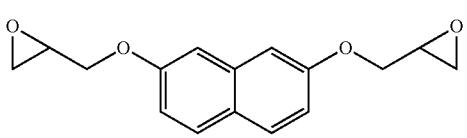

(q)
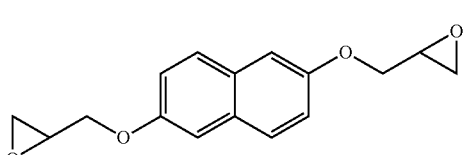

For example, the copolymer has a weight average molecular weight of 1,000 to 100,000, and preferably 1,000 to 10,000. When the weight average molecular weight of the copolymer is less than 1,000, the solvent resistance may be insufficient. The weight average molecular weight is a value obtained by gel permeation chromatography (hereinafter abbreviated as GPC in the specification) using polystyrene as a standard sample.

The composition for forming a resist underlayer film of the present invention may contain a cross-linkable compound. The cross-linkable compound is also called cross-linker. As the cross-linkable compound, a compound having at least two crosslink-forming substituents is preferably used. Examples thereof include a melamine-based compound, substituted urea-based compound, or aromatic compound that has at least two crosslink-forming substituents such as hydroxymethyl groups and alkoxymethyl groups, a compound having at least two epoxy groups, and a compound having at least two blocked isocyanate groups. Examples of the alkoxymethyl group include methoxymethyl group, 2-methoxyethoxymethyl group, and butoxymethyl group. As the cross-linkable compound, a nitrogen-containing compound having at least two, for example, two to four nitrogen atoms bonded to a hydroxymethyl group or an alkoxymethyl group is more preferably used. Examples of the nitrogen-containing compound include hex amethoxymethylmelamine, tetramethoxymethyl benzoguanamine, 1,3,4,6-tetrakis(methoxymethyl) glycoluril, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea.

Examples of the aromatic compound having at least two hydroxymethyl groups or alkoxymethyl groups include 1-hydroxybenzene-2,4,6-trimethanol, 3,3',5,5'-tetrakis(hydroxymethyl)-4,4'-dihydroxybiphenyl (trade name: TML-BP, available from Honshu Chemical Industry Co., Ltd.), 5,5'-[2,2,2-trifluoro-1-(trifluoromethyl)ethylidene]bis[2-hydroxy-1,3-benzenedimethanol] (trade name: TML-BPAF-MF, available from Honshu Chemical Industry Co., Ltd.), 2,2-dimethoxymethyl-4-t-butylphenol (trade name: DMOM-PTBP, available from Honshu Chemical Industry Co., Ltd.), 3,3',5,5'-tetramethoxymethyl-4,4'-dihydroxybiphenyl (trade name: TMOM-BP, available from Honshu Chemical Industry Co., Ltd.), bis(2-hydroxy-3-hydroxymethyl-5-methylphenyl)methane (trade name: DM-BIPC-F, available from Asahi Organic Chemicals Industry Co., Ltd.), bis(4-hydroxy-3-hydroxymethyl-5-methylphenyl)methane (trade name: DM-BIOC-F, available from Asahi Organic Chemicals Industry Co., Ltd.), and 5,5'-(1-methylethylidene)bis(2-hydroxy-1,3-benzenedimethanol) (trade name: TM-BIP-A, available from Asahi Organic Chemicals Industry Co., Ltd.).

Examples of the compound having at least two epoxy groups include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidyl aniline), 3,4-epoxycyclohexylmethyl-3,4-epoxycyclohexanecarboxylate, trimethylolethane triglycidyl ether, bisphenol-A-diglycidyl ether, EPOLEAD (registered trademark) GT-401, GT-403, GT-301, and GT-302, and CELLOXIDE (registered trademark) 2021 and 3000 available from Daicel Corporation, 1001, 1002, 1003, 1004, 1007, 1009, 1010, 828, 807, 152, 154, 180S75, 871, and 872 available from Mitsubishi Chemical Corporation, EPPN201, and 202, and EOCN-102, 103S, 104S, 1020, 1025, and 1027 available from NIPPON KAYAKU Co., Ltd., Denacol (registered trademark) EX-252, EX-611, EX-612, EX-614, EX-622, EX-411, EX-512, EX-522, EX-421, EX-313, EX-314, and EX-321 available from Nagase ChemteX Corporation, CY175, CY177, CY179, CY182, CY184, and CY192 available from BASF Japan Ltd., and EPICLON 200, 400, 7015, 835LV, and 850CRP available from DIC Corporation.

As the compound having at least two epoxy groups, a polymer compound may be used. The polymer compound can be used without particular limitation as long as it is a polymer having at least two epoxy groups. The polymer compound can be produced by addition polymerization using an addition-polymerizable monomer having an epoxy group or a reaction of a polymer having a hydroxy group with a compound having an epoxy group such as epichlorohydrin and glycidyl tosylate. Examples of the polymer having at least two epoxy groups include addition polymerization polymers such as polyglycidyl acrylate, a copolymer of glycidyl methacrylate with ethyl methacrylate, and a copolymer of glycidyl methacrylate, styrene, and 2-hydroxyethyl methacrylate, and condensation polymerization polymers such as epoxy novolac. For example, the polymer compound has a weight average molecular weight of 300 to 200,000. The weight average molecular weight is a value obtained by GPC using polystyrene as a standard sample.

As the compound having at least two epoxy groups, an epoxy resin having an amino group may also be used. Examples of such an epoxy resin include YH-434 and YH-434L (all available from NSCC Epoxy Manufacturing Co., Ltd.).

Examples of the compound having at least two blocked isocyanate groups include TAKENATE (registered trademark) B-830 and B-870N available from Mitsui Chemicals, Inc., and VESTANAT (registered trademark)-B1358/100 available from Evonik Degussa GmbH.

The compound may be used alone or two or more kinds thereof may be used in combination.

The content of the cross-linkable compound is, for example, 1% by mass to 80% by mass, and preferably 10% by mass to 60% by mass, relative to the content of the copolymer. When the content of the cross-linkable compound is too small or too large, the resistance of a film to be formed to a resist solvent may be insufficiently achieved.

In order to promote a cross-linking reaction, the composition for forming a resist underlayer film of the present invention contains a cross-linking catalyst in addition to the cross-linkable compound. As the cross-linking catalyst, a sulfonic acid compound or a carboxylic acid compound, or a thermal acid generator may be used. Examples of the sulfonic acid compound include p-toluenesulfonic acid, pyridinium-p-toluenesulfonate, 5-sulfosalicylic acid, 4-chlorobenzenesulfonic acid, 4-hydroxybenzenesulfonic acid, pyridinium-4-hydroxybenzene sulfonate, n-dodecylbenzenesulfonic acid, 4-nitrobenzenesulfonic acid, benzenedisulfonic acid, 1-naphthalenesulfonic acid, trifluoromethanesulfonic acid, and camphorsulfonic acid. Examples of the carboxylic acid compound include salicylic acid, citric acid, benzoic acid, and hydroxybenzoic acid. Examples of the thermal acid generator include K-PURE (registered trademark) CXC-1612, CXC-1614, TAG-2172, TAG-2179, TAG-2678, and TAG2689 (available from King Industries, Inc.), and SI-45, SI-60, SI-80, SI-100, SI-110, and SI-150 (available from SANSHIN CHEMICAL INDUSTRY CO., LTD.).

One kind of the cross-linking catalyst may be used or two or more kinds thereof may be used in combination. The content of the cross-linking catalyst is, for example, 1% by mass to 40% by mass, and preferably 5% by mass to 20% by mass, relative to the content of the cross-linkable compound.

The composition for forming a resist underlayer film of the present invention may contain a glycoluril derivative having four functional groups as an optional component in addition to the cross-linkable compound. Examples of the glycoluril derivative include 1,3,4,6-tetraallylglycoluril (trade name: TA-G, available from Shikoku Chemicals Corporation), 1,3,4,6-tetraglycidylglycoluril (trade name: TG-G, available from Shikoku Chemicals Corporation), 1,3,4,6-tetrakis(2-carboxyethyl)glycoluril (trade name: TC-G, available from Shikoku Chemicals Corporation), 1,3,4,6-tetrakis(2-hydroxyethyl)glycoluril (trade name: TH-G, available from Shikoku Chemicals Corporation), and 1,3,4,6-tetrakis(2-mercaptoethyl)glycoluril (trade name: TS-G, available from Shikoku Chemicals Corporation).

The glycoluril derivative may be added alone or two or more kinds thereof may be added in combination.

When the glycoluril derivative is used, the content of the glycoluril derivative is, for example, 1% by mass to 40% by mass, and preferably 5% by mass to 30% by mass, relative to the content of the copolymer.

The resist underlayer film-forming composition of the present invention may contain a surfactant as an optional component to improve application properties to a substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop (registered trademark) EF301, EF303, and EF352 (available from Mitsubishi Materials Electronic Chemicals Co., Ltd.), MEGAFACE (registered trademark) F171, F173, R-30, R-30N, and R-40-LM (available from DIC Corporation), Fluorad FC430 and FC431 (available from Sumitomo 3M, Ltd.), Asahi-Guard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin- Etsu Chemical Co., Ltd.). The surfactant may be added alone or two or more kinds thereof may be added in combination.

When the surfactant is used, the content of the surfactant is, for example, 0.01% by mass to 5% by mass, and preferably 0.1% by mass to 3% by mass, relative to the content of the copolymer.

The composition for forming a resist underlayer film of the present invention can be prepared by dissolving the above mentioned components in an appropriate solvent. The composition for forming a resist underlayer film can be used in a homogeneous solution state. As such a solvent, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methyl-2-pyrrolidone may be used. The solvent may be used alone or two or more kinds thereof may be used in combination. Further, a solvent having a high boiling point such as propylene glycol monobutyl ether and propylene glycol monobutyl ether acetate is mixed in the aforementioned solvent, and the mixture may be used.

It is preferable that the prepared composition be used after filtration through a filter having a pore diameter of 0.2 μm, 0.1 μm, or 0.05 μm, for example. The composition for forming a resist underlayer film of the present invention has excellent storage stability at room temperature for a long period.

Hereinafter, use of the composition for forming a resist underlayer film of the present invention will be described. The composition of the present invention is applied to a substrate having a recess (e.g., a semiconductor substrate such as a silicon wafer and a germanium wafer that may be coated with a silicon oxide film, a silicon nitride film, or a silicon nitride oxide film) by an appropriate applying method such as a spinner and a coater. The substrate is then baked by a heating means such as a hot plate to form a resist underlayer film. A baking condition is appropriately selected from a baking temperature of 80° C. to 250° C. and a baking time of 0.3 minutes to 10 minutes. The baking temperature is preferably 120° C. to 250° C. and the baking time is preferably 0.5 minutes to 5 minutes. The resist underlayer film has a thickness of 0.005 μm to 3.0 μm, for example, 0.01 μm to 0.1 μm or 0.05 μm to 0.5 μm.

When the temperature during baking is lower than the aforementioned range, cross-linking is insufficient, and intermixing between the resist underlayer film and a resist film to be formed as an upper layer may occur. When the temperature during baking is higher than the aforementioned range, intermixing between the resist underlayer film and the resist film may occur due to cutting of cross-linking.

Subsequently, the resist film is formed on the resist underlayer film. The resist film can be formed by a general method, that is, by applying a photoresist solution to the resist underlayer film, followed by baking.

The photoresist solution used to form the resist film is not particularly limited as long as it can be sensitive to light from a light source used in exposure. A negative or positive photoresist solution may be used.

In order to form a resist pattern, exposure through a mask (reticle) for formation of a predetermined pattern is carried out. For example, a KrF excimer laser or an ArF excimer laser can be used for exposure. After exposure, post exposure bake is carried out, if necessary. A "post exposure bake" condition is appropriately selected from a heating temperature of 80° C. to 150° C. and a heating time of 0.3 minutes to 10 minutes. After then, the resist pattern is formed through a step of development with an alkaline developer.

Examples of the alkaline developer include an alkaline aqueous solution including an aqueous solution of an alkali metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. Further, a surfactant or the like can be added to the developer. A development condition is appropriately selected from a development temperature of 5° C. to 50° C. and a development time of 10 seconds to 300 seconds.

EXAMPLES

Hereinafter, specific examples of the composition for forming a resist underlayer film of the present invention will be described with reference to the following Examples. The present invention is not limited to the Examples.

An apparatus and the like used in measurement of weight average molecular weight of reaction products obtained in the following Synthesis Examples are described.

Apparatus: HLC-8320GPC manufactured by TOSOH CORPORATION

GPC column: Asahipak (registered trademark) GF-310HQ, GF-510HQ, and GF-710HQ

Column temperature: 40° C.

Flow rate: 0.6 mL/min

Eluent: DMF

Standard sample: Polystyrene

Synthesis Example 1

10.00 g of 1,6-bis(2,3-epoxypropan-1-yloxy)naphthalene (trade name: HP-4032D, available from DIC Corporation), 7.94 g of 3,3'-dithiodipropionic acid (trade name: DTDPA, available from Sakai Chemical Industry Co., Ltd.), and 0.67 g of ethyltriphenylphosphonium bromide as a catalyst were added to 74.45 g of propylene glycol monomethyl ether (hereinafter abbreviated as PGME in the specification). The mixture was reacted at 105° C. for 17 hours, to obtain a solution containing a reaction product. The obtained reaction product was analyzed by GPC. The weight average molecular weight in terms of standard polystyrene was 4300. The obtained reaction product is presumed to be a copolymer having a structural unit of the following formula (1A).

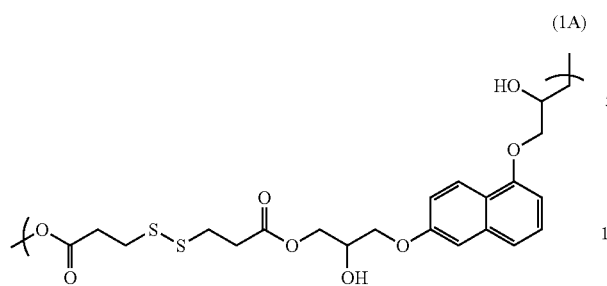

(1A)

Synthesis Example 2

10.00 g of 1,6-bis(2,3-epoxypropan-1-yloxy)naphthalene (trade name: HP-4032D, available from DIC Corporation), 8.32 g of 3,3'-dithiodipropionic acid (trade name: DTDPA, available from Sakai Chemical Industry Co., Ltd.), and 0.67 g of ethyltriphenylphosphonium bromide as a catalyst were added to 75.96 g of PGME. The mixture was reacted at 105° C. for 17 hours, to obtain a solution containing a reaction product. The obtained reaction product was analyzed by GPC. The weight average molecular weight in terms of standard polystyrene was 3200. The obtained reaction product is presumed to be a copolymer having a structural unit of the following formula (1B).

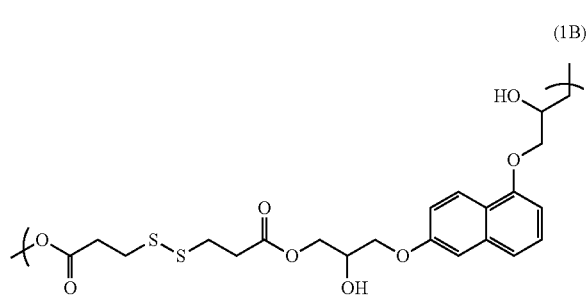

(1B)

Synthesis Example 3

10.00 g of 1,6-bis(2,3-epoxypropan-1-yloxy)naphthalene (trade name: HP-4032D, available from DIC Corporation), 5.07 g of diglycolic acid (available from Tokyo Chemical Industry Co., Ltd.), and 0.67 g of ethyltriphenylphosphonium bromide as a catalyst were added to 62.94 g of PGME. The mixture was reacted with refluxing under heating at 140° C. for 17 hours, to obtain a solution containing a reaction product. The obtained reaction product was analyzed by GPC. The weight average molecular weight in terms of standard polystyrene was 3300. The obtained reaction product is presumed to be a copolymer having a structural unit of the following formula (1C).

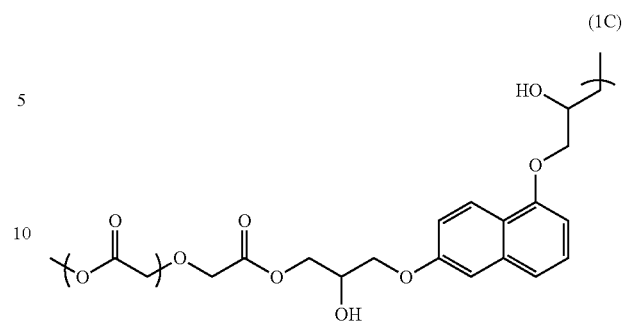

(1C)

Synthesis Example 4

25.00 g of diglycidyl terephthalate (trade name: EX-711 available from Nagase ChemteX Corporation), 13.21 g of 2,2-dimethylsuccinic acid (available from Midori Kagaku Co., Ltd.), and 1.60 g of ethyltriphenylphosphonium bromide as a catalyst were added to 61.59 g of PGME. The mixture was reacted at 105° C. for 24 hours, to obtain a solution containing a reaction product. The obtained reaction product was analyzed by GPC. The weight average molecular weight in terms of standard polystyrene was 7800. The obtained reaction product is presumed to be a copolymer having a structural unit of the following formula (2).

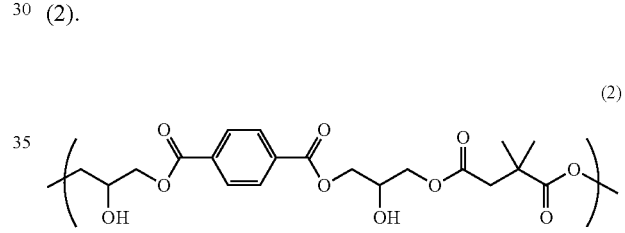

(2)

Synthesis Example 5

10.00 g of 1,4-butanediol diglycidyl ether (trade name: 1,4-BD-DEP(P), available from Toyo Fine Chem), 10.51 g of 3,3'-dithiodipropionic acid (trade name: DTDPA, available from Sakai Chemical Industry Co., Ltd.), and 0.93 g of ethyltriphenylphosphonium bromide as a catalyst were added to 85.76 g of PGME. The mixture was reacted at 105° C. for 20 hours, to obtain a solution containing a reaction product. The obtained reaction product was analyzed by GPC. The weight average molecular weight in terms of standard polystyrene was 3700. The obtained reaction product is presumed to be a copolymer having a structural unit of the following formula (3).

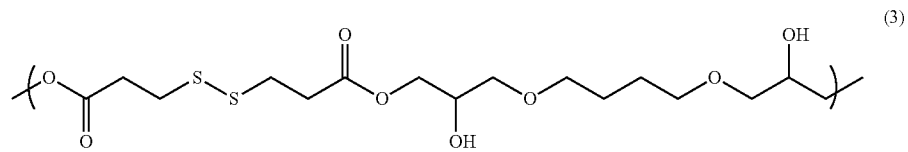

(3)

Preparation of Composition for Forming Resist Underlayer Film

Example 1

In 58.47 g of the solution containing 9.60 g of the copolymer obtained in Synthesis Example 1 (a solvent was PGME used during synthesis), 231.35 g of PGME, 32.83 g of propylene glycol monomethyl ether acetate, 2.40 g of tetramethoxymethyl glycoluril (trade name: POWDER-LINK 1174 available from Nihon Cytec Industries Inc.), 0.24 g of 5-sulfosalicylic acid (available from Tokyo Chemical Industry Co., Ltd.), and 0.0096 g of surfactant (trade name: R-30N available from DIC Corporation) were mixed to obtain a 3.5% by mass solution. The solution was filtered through a microfilter made of polytetrafluoroethylene having a pore diameter of 0.2 µm to prepare a composition for forming a resist underlayer film.

Example 2

In 63.28 g of the solution containing 9.60 g of the copolymer obtained in Synthesis Example 2 (a solvent was PGME used during synthesis), 226.53 g of PGME, 32.83 g of propylene glycol monomethyl ether acetate, 2.40 g of tetramethoxymethyl glycoluril (trade name: POWDER-LINK 1174 available from Nihon Cytec Industries Inc.), 0.24 g of 5-sulfosalicylic acid (available from Tokyo Chemical Industry Co., Ltd.), and 0.0096 g of surfactant (trade name: R-30N available from DIC Corporation) were mixed to obtain a 3.5% by mass solution. The solution was filtered through a microfilter made of polytetrafluoroethylene having a pore diameter of 0.2 µm to prepare a composition for forming a resist underlayer film.

Example 3

In 60.05 g of the solution containing 9.99 g of the copolymer obtained in Synthesis Example 1 (a solvent was PGME used during synthesis), 229.19 g of PGME, 32.79 g of propylene glycol monomethyl ether acetate, 2.00 g of tetramethoxymethyl glycoluril (trade name: POWDER-LINK 1174 available from Nihon Cytec Industries Inc.), 0.25 g of 5-sulfosalicylic acid (available from Tokyo Chemical Industry Co., Ltd.), and 0.010 g of surfactant (trade name: R-30N available from DIC Corporation) were mixed to obtain a 3.5% by mass solution. The solution was filtered through a microfilter made of polytetrafluoroethylene having a pore diameter of 0.2 µm to prepare a composition for forming a resist underlayer film.

Example 4

In 1.64 g of the solution containing 0.27 g of the copolymer obtained in Synthesis Example 3 (a solvent was PGME used during synthesis), 6.64 g of PGME, 0.94 g of propylene glycol monomethyl ether acetate, 0.069 g of tetramethoxymethyl glycoluril (trade name: POWDER-LINK 1174 available from Nihon Cytec Industries Inc.), 0.0069 g of 5-sulfosalicylic acid (available from Tokyo Chemical Industry Co., Ltd.), and 0.00027 g of surfactant (trade name: R-30N available from DIC Corporation) were mixed to obtain a 3.5% by mass solution. The solution was filtered through a microfilter made of polytetrafluoroethylene having a pore diameter of 0.2 µm to prepare a composition for forming a resist underlayer film.

Example 5

In 3.78 g of the solution containing 0.60 g of the copolymer obtained in Synthesis Example 2 (a solvent was PGME used during synthesis), 19.47 g of PGME, 0.091 g of tetramethoxymethyl glycoluril (trade name: POWDER-LINK 1174 available from Nihon Cytec Industries Inc.), 0.015 g of 5-sulfosalicylic acid (available from Tokyo Chemical Industry Co., Ltd.), 0.091 g of 1,3,4,6-tetrakis(2-hydroxyethyl)glycoluril (trade name: TH-G, available from Shikoku Chemicals Corporation), and 0.00060 g of surfactant (trade name: R-30N available from DIC Corporation) were mixed to obtain a 3.2% by mass solution. The solution was filtered through a microfilter made of polytetrafluoroethylene having a pore diameter of 0.2 µm to prepare a composition for forming a resist underlayer film.

Comparative Example 1

In 53.44 g of the solution containing 10.17 g of the copolymer obtained in Synthesis Example 4 (a solvent was PGME used during synthesis), 185.49 g of PGME, 90.732 g of propylene glycol monomethyl ether acetate, 3.39 g of tetramethoxymethyl glycoluril (trade name: POWDER-LINK 1174 available from Nihon Cytec Industries Inc.), 0.34 g of 5-sulfosalicylic acid (available from Tokyo Chemical Industry Co., Ltd.) as a thermal acid generator, and 0.10 g of surfactant (trade name: R-30N available from DIC Corporation) were mixed to obtain a 4.0% by mass solution. The solution was filtered through a microfilter made of polytetrafluoroethylene having a pore diameter of 0.2 µm to prepare a composition for forming a resist underlayer film.

Comparative Example 2

In 2.07 g of the solution containing 0.31 g of the copolymer obtained in Synthesis Example 5 (a solvent was PGME used during synthesis), 6.11 g of PGME, 0.93 g of propylene glycol monomethyl ether acetate, 0.078 g of tetramethoxymethyl glycoluril (trade name: POWDER-LINK 1174 available from Nihon Cytec Industries Inc.), 0.0078 g of 5-sulfosalicylic acid (available from Tokyo Chemical Industry Co., Ltd.) as a thermal acid generator, and 0.00031 g of surfactant (trade name: R-30N available from DIC Corporation) were mixed to obtain a 4.0% by mass solution. The solution was filtered through a microfilter made of polytetrafluoroethylene having a pore diameter of 0.2 µm to prepare a composition for forming a resist underlayer film.

[Elution Test into Photoresist Solvent]

The composition for forming a resist underlayer film prepared in each of Examples 1 to 5 and Comparative Examples 1 and 2 was applied to a silicon wafer by a spinner, and then baked on a hot plate at 215° C. for one minute to form each resist underlayer film (thickness: 0.1 µm). The resist underlayer films were each immersed in PGME that was a solvent used for a photoresist solution and propylene glycol monomethyl ether acetate. It was confirmed that the resist underlayer films were insoluble in both the solvents. The resist underlayer films were each immersed in an alkaline developer for photoresist development (2.38% by mass tetramethylammonium hydroxide aqueous solution). It was confirmed that the resist underlayer films were insoluble in the developer. In "solvent resistance" of Table 1, the results in which the resist underlayer films are insoluble are described as "0." In Table 1, "PGMEA" is propylene glycol monomethyl ether acetate used in the test, and "NMD-3" is the alkaline developer used in the test.

[Test of Optical Parameter]

The composition for forming a resist underlayer film prepared in each of Examples 1 to 5 and Comparative Examples 1 and 2 was applied to a silicon wafer by a spinner, and then baked on a hot plate at 215° C. for one minute to form each resist underlayer film (thickness: 0.1 µm). The refractive index (n value) and extinction coefficient (k value) of the resist underlayer films were measured at wavelengths of 193 nm and 248 nm by an ellipsometer (VUV-VASE VU-302 manufactured by J. A. Woollam Co.). The results are shown in Table 1. It is desirable that the resist underlayer films have a k value of 0.1 or more at wavelengths of 193 nm and 248 nm to have a sufficient antireflection function.

[Measurement of Dry Etching Rate]

A resist underlayer film was formed on a silicon wafer in the same manner as described above using the composition for forming a resist underlayer film prepared in each of Examples 1 to 5 and Comparative Examples 1 and 2. The dry etching rate of the resist underlayer films was measured under a condition of using a RIE system manufactured by SAMCO INC., and using $N_2$ as dry etching gas. A photoresist solution (trade name: V146G available from JSR Corporation) was applied to a silicon wafer by a spinner, and baked on a hot plate at 110° C. for one minute to form a photoresist film. The dry etching rate of the photoresist film was measured under a condition of using a ME system manufactured by SAMCO INC., and using $N_2$ as dry etching gas. The dry etching rate of each of the resist underlayer films was calculated relative to the dry etching ratio of the photoresist film as 1.00. The results are shown as "selection ratio" in Table 1. The results show that the dry etching rates of the resist underlayer films formed using the compositions for forming a resist underlayer film prepared in Examples 1 to 5 and Comparative Examples 1 and 2 are sufficiently larger than the dry etching rate of the photoresist film.

[Measurement of Sublimate Amount]

A silicon wafer having a diameter of 4 inches was spin coated with the composition for forming a resist underlayer film prepared in each of Examples 1 to 5 and Comparative Examples 1 and 2 at 1,500 rpm for 60 seconds. The silicon wafer was set in a sublimate amount measurement apparatus (see International publication WO2007/111147 Pamphlet) integrated with a hot plate, and baked for 120 seconds. The sublimate was collected by a quartz crystal microbalance (QCM) sensor, that is, a quartz crystal unit having an electrode. The QCM sensor can measure slight mass change using a property in which the frequency of the quartz crystal unit is changed (decreased) depending on the mass of the sublimate that is attached to a surface (electrode) of the quartz crystal unit.

A detailed measurement protocol is as follows. The temperature of the hot plate of the sublimate amount measurement apparatus was set to 215° C., the pump flow rate was set to 1 m³/s, and the apparatus was left for first 60 seconds to stabilize the apparatus. Immediately, the silicon wafer coated with the composition for forming a resist underlayer film was placed on the hot plate rapidly from a slide outlet, and the sublimate was collected from a time point of 60 seconds to a time point of 180 seconds (for 120 seconds). The resist underlayer film formed on the silicon wafer had a thickness of 0.1 µm.

A flow attachment (detection part) connecting the QCM sensor of the sublimate amount measurement apparatus to a catching funnel part was used without a nozzle. Thus, a gas flow was poured without being restricted from a flow channel (caliber: 32 mm) of a chamber unit located at a distance of 30 mm from the sensor (quartz crystal unit). The QCM sensor in which a material (AlSi) having silicon and aluminum as main components was used as an electrode, the diameter of the quartz crystal unit (sensor diameter) was 14 mm, the diameter of the electrode on a surface of the quartz crystal unit was 5 mm, and the resonant frequency was 9 MHz was used.

The obtained frequency change of eigenvalue of the quartz crystal unit used in the measurement was converted into grams, and a relationship between the sublimate amount in one wafer on which the resist underlayer film was applied and time course was clarified. Table 1 shows the sublimate amount generated from the compositions for forming a resist underlayer film of Examples 1 to 4 and Comparative Example 2 relative to the sublimate amount generated from the composition for forming a resist underlayer film of Comparative Example 1 as 1.00. The results shows that the sublimate amounts generated from the compositions for forming a resist underlayer film of Examples 1 to 4 are smaller than the sublimate amount generated from the composition obtained in Comparative Example 1.

[Evaluation of Photoresist Pattern Shape]

The compositions for forming a resist underlayer film prepared in Examples 1 to 5 and Comparative Examples 1 and 2 were each applied to a silicon wafer by a spinner, and then baked at 215° C. for one minute on a hot plate to form a resist underlayer film having a thickness of 0.1 µm. A commercially available photoresist solution (trade name: SEPR-430 available from Shin-Etsu Chemical Co., Ltd.) was applied to the resist underlayer film by a spinner, and baked on a hot plate at 100° C. for 60 seconds, to form a photoresist film (thickness: 0.55 µm).

Subsequently, exposure was carried out by a scanner NSRS205C manufactured by Nikon Corporation (wavelength: 248 nm, NA: 0.75, σ: 0.43/0.85 (ANNULAR)) through a photomask so that nine lines of photoresist having a width of 0.17 µm at an interval between the lines of photoresist of 0.17 µm, that was, having line and space widths of 0.17 µm (dense line), were formed. Post exposure bake (PEB) was carried out at 110° C. for 60 seconds on a hot plate. After cooling, the photoresist film was developed using a 0.26 N tetramethylammonium hydroxide aqueous solution as a developer by a 60-second single puddle process in accordance with industrial standard.

A cross section of the obtained photoresist pattern in a direction perpendicular to the substrate, that was, the silicon wafer was observed by a scanning electron microscope (SEM). From results of observation, the cross-sectional shapes of photoresist patterns using the compositions for forming a resist underlayer film prepared in Examples 1 to 5 were a favorable straight skirt shape, that was, a substantially rectangular shape. On the other hand, when the compositions for forming a resist underlayer film prepared in Comparative Examples 1 and 2 were used, disappearance of pattern after development was confirmed. In "lithography characteristics," that is, photolithography characteristics of Table 1, a case where the cross-sectional shape of the photoresist pattern is a straight skirt shape, that is, a substantially rectangular shape is described as "○," and a case where a targeted photoresist pattern is not obtained is described as "x."

FIGS. 1 to 5 show cross-sectional SEM images of photoresist patterns finally formed on the substrates using the compositions for forming a resist underlayer film of Examples 1 to 5, respectively.

TABLE 1

| | Solvent resistance | | | Optical parameter | | | | Etching selection ratio | Sublimate amount | Lithography characteristics |
| | | | | 193 nm | | 248 nm | | | | |
| | PGME | PGMEA | NMD-3 | n value | k value | n value | k value | | | |
|---|---|---|---|---|---|---|---|---|---|---|
| Example 1 | ○ | ○ | ○ | 1.69 | 0.18 | 1.81 | 0.30 | 1.94 | 0.18 | ○ |
| Example 2 | ○ | ○ | ○ | 1.69 | 0.18 | 1.81 | 0.29 | 1.93 | 0.45 | ○ |
| Example 3 | ○ | ○ | ○ | 1.69 | 0.18 | 1.81 | 0.30 | 1.91 | 0.33 | ○ |
| Example 4 | ○ | ○ | ○ | 1.60 | 0.14 | 1.78 | 0.32 | 1.84 | 0.56 | ○ |
| Example 5 | ○ | ○ | ○ | 1.69 | 0.18 | 1.79 | 0.28 | 1.93 | 1.34 | ○ |
| Comparative Example 1 | ○ | ○ | ○ | 1.63 | 0.31 | 1.70 | 0.19 | 2.14 | 1.00 | x |
| Comparative Example 2 | ○ | ○ | ○ | 1.80 | 0.09 | 1.65 | 0.01 | 4.04 | 4.33 | x |

In the results in Table 1, k values at 193 nm and 248 nm of the resist underlayer films formed from the compositions for forming a resist underlayer film prepared in Examples 1 to 5 and Comparative Example 1 are larger than 0.1. This shows that the resist underlayer films have an anti-reflection function in both ArF and KrF processes. However, the k value of the resist underlayer film formed from the composition for forming a resist underlayer film prepared in Comparative Example 2 is smaller than 0.1. This shows that the resist underlayer film does not have a sufficient anti-reflection function. Further, the dry etching rates of the resist underlayer films formed from the compositions for forming a resist underlayer film prepared in Examples 1 to 5 and Comparative Examples 1 and 2 are largely higher than the dry etching rate of the photoresist film. Moreover, the sublimate amounts of the resist underlayer films formed from the compositions for forming a resist underlayer film in Examples 1 to 4 are largely smaller than the sublimate amounts of the resist underlayer films formed from the compositions for forming a resist underlayer film in Comparative Examples 1 and 2. The cross-sectional shapes of photoresist patterns obtained using the compositions for forming a resist underlayer film prepared in Examples 1 to 5 were a favorable straight skirt shape, that was, a substantially rectangular shape.

As shown from these results, a resist underlayer film having low sublimation, a high dry etching rate, and an anti-reflection function in both ArF and KrF processes may be formed from the compositions for forming a resist underlayer film prepared in Examples 1 to 5.

[Test of Embeddability (Filling Properties)]

Figure 6:
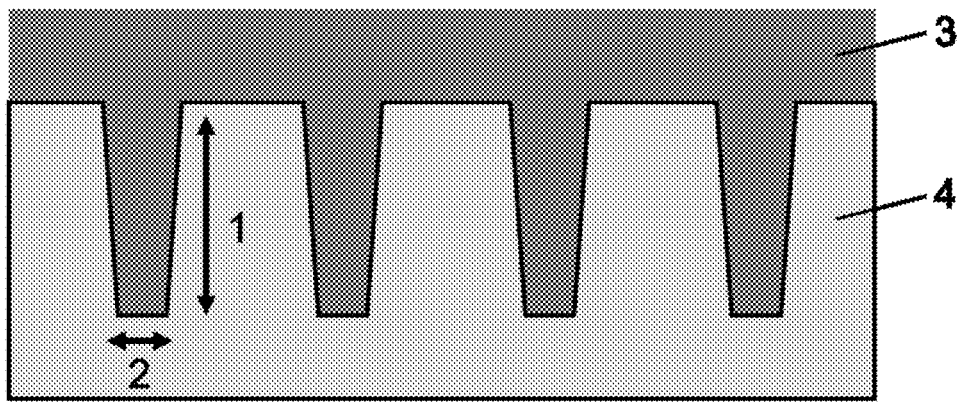
FIG. 6 is a schematic view illustrating a cross section of a SiO$_2$ wafer used in a test of embeddability in a trench (filling properties) of a resist underlayer film.

The composition for forming a resist underlayer film in each of Examples 1 to 5 and Comparative Examples 1 and 2 was applied to a silicon wafer having a plurality of trenches (width: 0.04 μm, depth: 0.3 μm) and a SiO$_2$ film on a surface (hereinafter abbreviated as SiO$_2$ wafer in the specification) by a spinner, and then baked on a hot plate at 215° C. for one minute to form each resist underlayer film (thickness: 0.1 μm). FIG. 6 is a schematic view of a SiO$_2$ wafer 4 used in this test and a resist underlayer film 3 formed on the wafer. The wafer 4 has trenches in a dense pattern (Dense). The dense pattern is a pattern in which a distance between the center of each trench and the center of each adjacent trench is 3 times the trench width. A depth 1 of the trenches of the SiO$_2$ wafer shown in FIG. 6 is 0.3 μm and a width 2 of the trenches is 0.04 μm.

Figure 7:
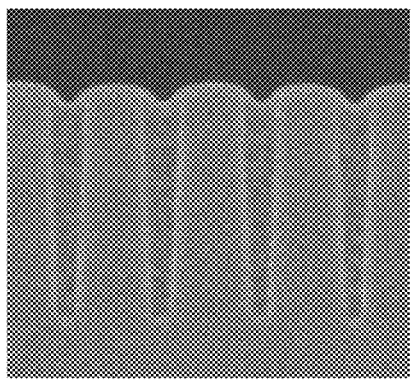
FIG. 7 is a cross-sectional SEM image of a SiO$_2$ wafer in which a hole is filled with a resist underlayer film formed from the composition for forming a resist underlayer film of Example 1.
Figure 8:
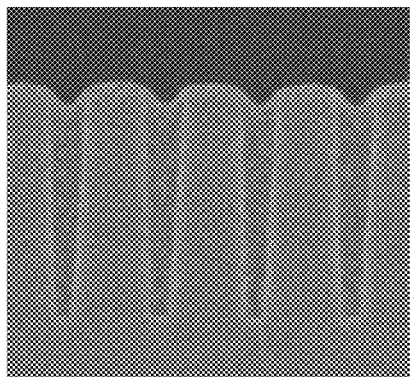
FIG. 8 is a cross-sectional SEM image of a SiO$_2$ wafer in which a hole is filled with a resist underlayer film formed from the composition for forming a resist underlayer film of Example 2.
Figure 9:
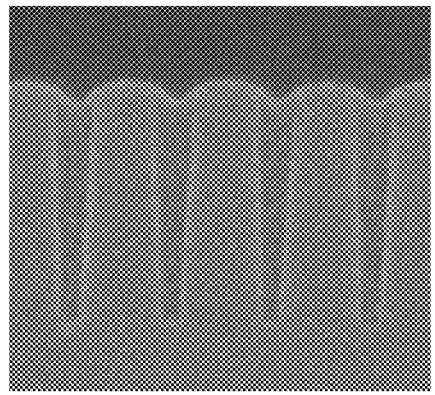
FIG. 9 is a cross-sectional SEM image of a SiO$_2$ wafer in which a hole is filled with a resist underlayer film formed from the composition for forming a resist underlayer film of Example 3.
Figure 10:
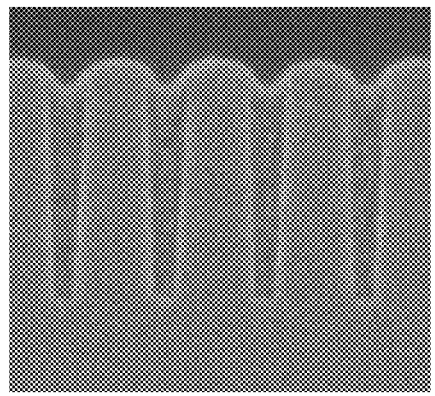
FIG. 10 is a cross-sectional SEM image of a SiO$_2$ wafer in which a hole is filled with a resist underlayer film formed from the composition for forming a resist underlayer film of Example 4.
Figure 11:
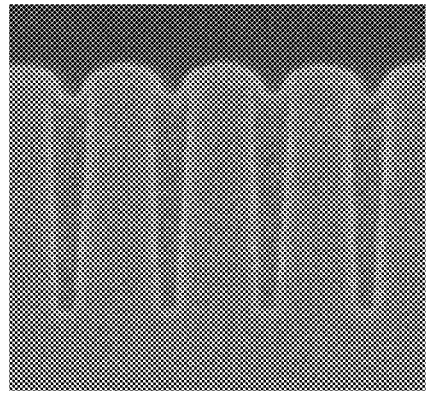
FIG. 11 is a cross-sectional SEM image of a SiO$_2$ wafer in which a hole is filled with a resist underlayer film formed from the composition for forming a resist underlayer film of Example 5.
Figure 12:
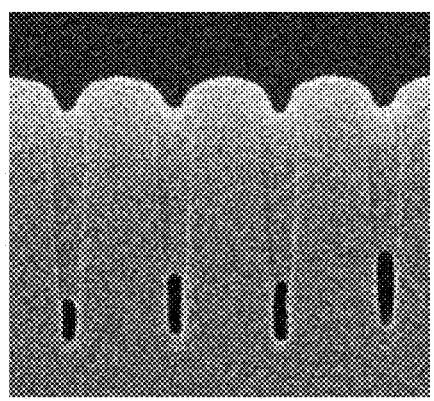
FIG. 12 is a cross-sectional SEM image of a SiO$_2$ wafer in which a hole is filled with a resist underlayer film formed from a composition for forming a resist underlayer film of Comparative Example 1.
Figure 13:
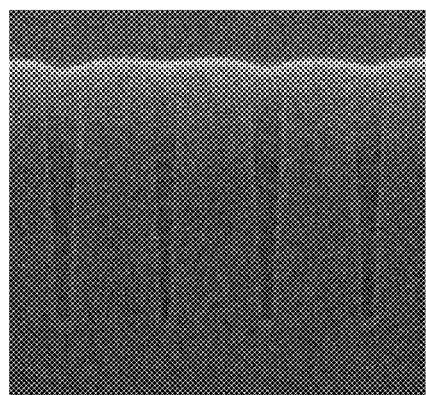
FIG. 13 is a cross-sectional SEM image of a SiO$_2$ wafer in which a hole is filled with a resist underlayer film formed from a composition for forming a resist underlayer film of Comparative Example 2.

As described above, the composition for forming a resist underlayer film in each of Examples 1 to 5 and Comparative Examples 1 and 2 was applied to a SiO$_2$ wafer and baked to form the resist underlayer film. The cross-sectional shape of the SiO$_2$ wafer was observed by a scanning electron microscope (SEM). The embeddability (filling properties) in trenches of the SiO$_2$ wafer by the resist underlayer film was evaluated. The obtained results are shown in FIGS. 7 (Example 1) to 11 (Example 5), FIG. 12 (Comparative Example 1), and FIG. 13 (Comparative Example 2).

As seen in FIGS. 7 to 11, and 13, voids (gaps) in the trench part were not observed, and the trenches were filled with the resist underlayer film and the whole trenches were completely filled. However, in FIG. 12, voids in the trench part were observed. The inside of holes was not filled with the resist underlayer film, and the whole trench was not completely filled.

DESCRIPTION OF SYMBOLS

1 depth of trench of SiO$_2$ wafer
2 width of trench of SiO$_2$ wafer
3 resist underlayer film
4 SiO$_2$ wafer

The invention claimed is:

1. A composition for forming a resist underlayer film comprising
a copolymer having a structural unit of the following formula (1):

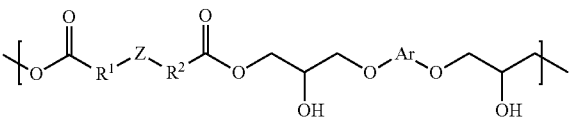

wherein R$^1$ and R$^2$ are each independently a C$_{1-3}$ alkylene group or a single bond, Z is an —O— group, a —S— group, or a —S—S— group, and Ar is an arylene group, wherein the arylene group is a phenylene group or a naphthylene group,
a glycoluril compound selected from the group consisting of 1,3,4,6-tetraallylglycoluril, 1,3,4,6-tetraglycidylglycoluril, 1,3,4,6-tetrakis (2-carboxyethyl) glycoluril, 1,3,4,6-tetrakis (2-hydroxyethyl) glycoluril and 1,3,4,6-tetrakis (2-mercaptoethyl) glycoluril,
a compound different from the glycoluril compound, wherein the compound is at least one compound selected from the group consisting of a nitrogen-containing compound having at least two nitrogen atoms bonded to hydroxymethyl groups or alkoxymethyl groups, an aromatic compound having at least two hydroxymethyl groups or alkoxymethyl groups, a compound having at least two epoxy groups, and a compound having at least two blocked isocyanate groups, a cross-linking catalyst, and a solvent.

2. The composition for forming a resist underlayer film according to claim 1, further comprising a surfactant.

3. The composition for forming a resist underlayer film according to claim 1, wherein the copolymer has a weight average molecular weight of 1,000 to 10,000.

* * * * *